(12) United States Patent
Sustek et al.

(10) Patent No.: US 8,159,830 B2
(45) Date of Patent: Apr. 17, 2012

(54) SURFACE MOUNTING CHIP CARRIER MODULE

(75) Inventors: Laurent Sustek, Auriol (FR); Stephane Di Vito, La Ciotat (FR)

(73) Assignee: Atmel Corporation, San Jose, CA (US)

( * ) Notice: Subject to any disclaimer, the term of this patent is extended or adjusted under 35 U.S.C. 154(b) by 365 days.

(21) Appl. No.: 12/426,106

(22) Filed: Apr. 17, 2009

(65) Prior Publication Data

US 2010/0263922 A1    Oct. 21, 2010

(51) Int. Cl.
*H01L 23/02* (2006.01)
(52) U.S. Cl. .................................................... 361/764
(58) Field of Classification Search .................. 257/778, 257/738, 686, 693; 361/760, 764
See application file for complete search history.

(56) References Cited

U.S. PATENT DOCUMENTS

| | | | | |
|---|---|---|---|---|
| 5,239,198 A * | 8/1993 | Lin et al. | ........................ | 257/693 |
| 5,719,440 A * | 2/1998 | Moden | ........................... | 257/697 |
| 5,729,437 A * | 3/1998 | Hashimoto | ................... | 361/760 |
| 5,736,789 A * | 4/1998 | Moscicki | ....................... | 257/774 |
| 5,869,889 A * | 2/1999 | Chia et al. | ...................... | 257/701 |
| 5,973,395 A * | 10/1999 | Suzuki et al. | .................. | 257/692 |
| 6,172,419 B1 * | 1/2001 | Kinsman | ........................ | 257/737 |
| 6,262,513 B1 * | 7/2001 | Furukawa et al. | ........ | 310/313 R |
| 6,365,963 B1 * | 4/2002 | Shimada | ........................ | 257/686 |
| 6,365,978 B1 * | 4/2002 | Ibnabdeljalil et al. | ........ | 257/786 |
| 6,395,578 B1 * | 5/2002 | Shin et al. | ..................... | 438/106 |
| 6,472,732 B1 * | 10/2002 | Terui | .............................. | 257/678 |
| 6,483,184 B2 * | 11/2002 | Murata | ......................... | 257/698 |
| 6,798,049 B1 * | 9/2004 | Shin et al. | ..................... | 257/678 |
| 6,882,546 B2 * | 4/2005 | Miller | ........................... | 361/783 |
| 6,972,481 B2 * | 12/2005 | Karnezos | ...................... | 257/686 |
| 7,397,001 B2 * | 7/2008 | Owen | .............................. | 174/260 |
| 7,514,350 B2 * | 4/2009 | Hashimoto | ................... | 438/611 |
| 7,608,920 B2 * | 10/2009 | Wehrly, Jr. | .................... | 257/686 |

FOREIGN PATENT DOCUMENTS

JP                57-69765        *    4/1982

* cited by examiner

*Primary Examiner* — Neil Abrams
(74) *Attorney, Agent, or Firm* — Fish & Richardson P.C.

(57) ABSTRACT

A device includes a carrier and an integrated circuit chip having a first side supported by the carrier and a second side having contacts. The carrier has multiple carrier contacts supported by the carrier and separated from the integrated circuit chip. Multiple leads are coupled between the contacts on the integrated circuit chip and the multiple carrier contacts. A resin encapsulates the integrated circuit chip leaving the multiple carrier contacts at least partially uncovered for attaching to a card or board.

20 Claims, 3 Drawing Sheets

SURFACE MOUNTING CHIP CARRIER MODULE

BACKGROUND

Smart cards utilize a dedicated connector to connect to computer chip modules. The connectors tend to take up a significant amount of space, and also are a source of failures. Still further, the computer chip module has a footprint that is too large compared to the overall smart card size, and are not amenable to connection by the use of solder.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A smart card may include a subscriber identity module (SIM) application that enable GSM modem to connect a GSM network infrastructure. The SIM application is an embedded software executed onto an integrated circuit (IC) chip that has multiple contacts for making connections to a printed circuit board (PCB). In the various embodiments described, the IC chip may have multiple IC contacts for attaching lead wires. One side of the IC chip may be fastened to a module carrier or substrate having carrier contacts formed adjacent to multiple edges of the IC chip, with leads coupling the substrate contacts to the IC chip contacts. The IC chip may be encapsulated with a resin or other protective, electrically insulative material. The resin may extend over the substrate to partially cover the substrate contacts.

The substrate may be placed on a PCB or card, with matting contacts formed directly adjacent the carrier contacts, facilitating electrical connection to the IC chip by solder or other conductive material such as conductive glue. The PCB may then be placed on a smart card, which may include plastic cards, such as credit and debit cards to name a few. In one embodiment, such cards may thus provide machine to machine communication abilities, using the SIM to provide proper credentials for accessing or otherwise communicating with other machines, without human intervention. In further embodiments, the IC chip may implement a variety of different applications, such as trusted platform module (TPM) or other access control mechanisms, RF chips, passport IDs, and other applications.

Figure 1:
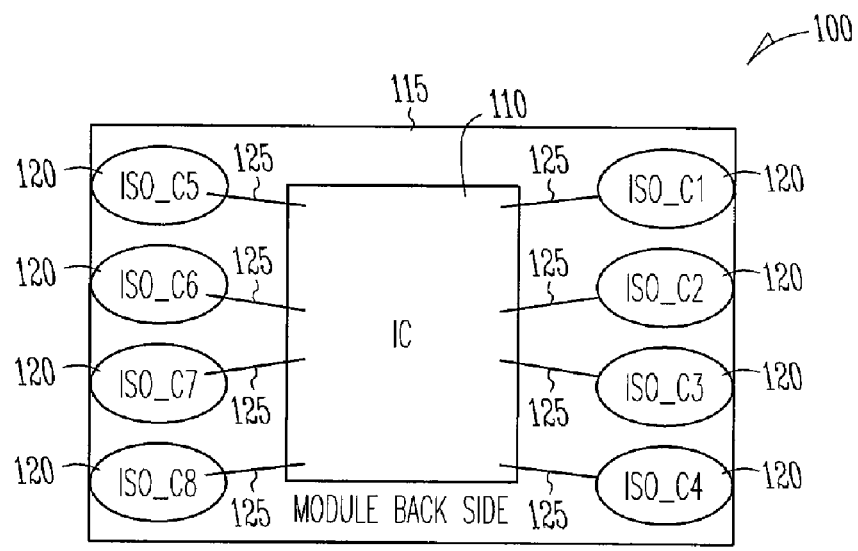
FIG. 1 is a block diagram representative of a chip carrier module having multiple contacts according to an example embodiment.

FIG. 1 is a block diagram representative of a chip carrier module 100. An IC 110 is coupled to a module substrate or carrier 115 by gluing or otherwise. In one embodiment, the IC 110 is centered on the carrier 115. Multiple carrier contacts 120 are formed near or abutting edges of the carrier 115. The carrier contacts 120 may be positioned adjacent edges of the carrier 115 in a manner that facilitates forming electrical contact with mating contacts when carrier 115 is placed on a PCB or other board or card on which the carrier module 100 may be mounted. The carrier contacts 120 may be electrically coupled to contacts on the IC 110 via leads 125, such as by wire bonding. In one embodiment, the leads 125 may be coupled to the carrier contacts 120 at a portion of the carrier contacts 120 that is closer to the IC 110.

Figure 2:
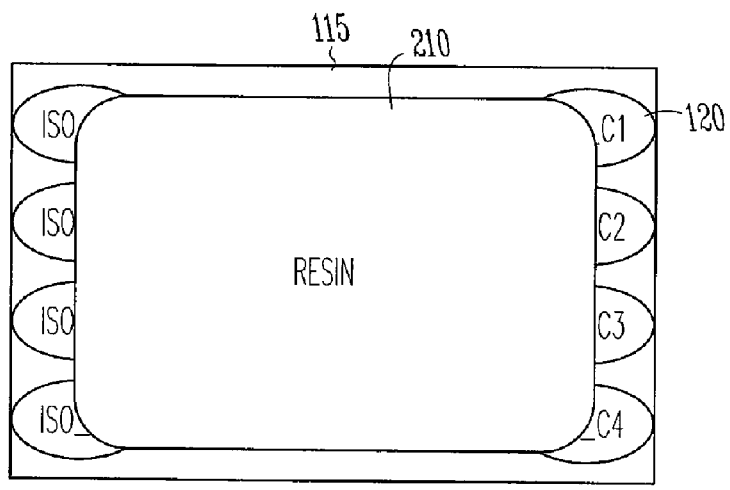
FIG. 2 is a block diagram representation of the module of FIG. 1 having a resin formed over part of the module according to an example embodiment.

FIG. 2 is a block diagram representation of the carrier module 100 of FIG. 1 having a resin 210 formed over part of the carrier module 100. In one embodiment, the resin 210 covers the entire IC 110, and extends beyond the IC to partially cover the carrier contacts 120. The resin 210 may be formed of an electrically insulating material and may completely cover the leads 125 that are coupled to the carrier contacts 120. The complete coverage of the leads 125 may be facilitated by the coupling of the leads to the carrier contacts 120 on portions of the carrier contacts 120 that are closer to the IC 110 than edges of the carrier 115. In one embodiment, at least a portion of the carrier contacts 120 remain exposed to facilitate later electrical connection. In one embodiment, approximately one-half of selected contacts is covered by the resin. The amount of coverage may vary, as can be seen by contacts near a corner of the carrier 115, where the resin may have a curved portion.

The shape of the resin 210 may be obtained with the use of molding, or a ring, such as a silicon ring that limits the coverage of the resin 210 to that desired. The use of the resin provides for protection of the IC, and helps prevent shorts between leads. Further, by limiting the coverage of the resin, the carrier contacts 120 are accessible to provide connections to the IC 110.

Figure 3:
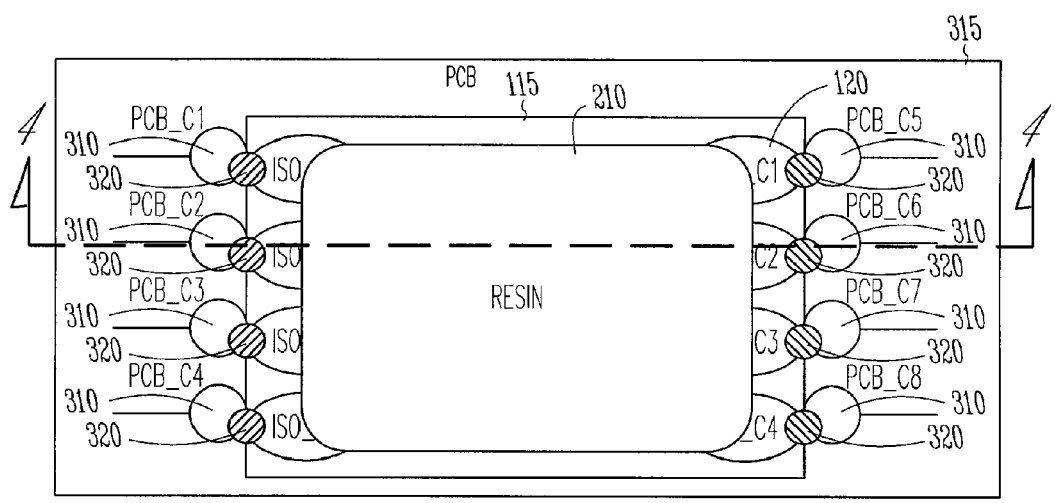
FIG. 3 is a block diagram of the module of FIG. 2 having contacts soldered to contacts on a printed circuit board according to an example embodiment.

FIG. 3 is a block diagram of the carrier module 100 of FIG. 2 having carrier contacts 120 soldered to PCB contacts 310 on a printed circuit board, PCB 315, according to an example embodiment. In further embodiments, PCB 315 may be a standard printed circuit board, or various types of cards, such as plastic cards used as credit, debit, gift or other financial cards. In some embodiments, the carrier module 100 may be fastened to a plastic card by glue, such as a conductive or non-conductive glue. Plastic cards may be used without contacts formed on the plastic cards in one embodiment. The plastic card may be used to provide a handling mechanism for later coupling of the module 100 to other electronic devices.

In one embodiment, the PCB contacts 310 are arranged in a manner to be adjacent the carrier contacts 120 when the carrier module 100 is placed on the PCB 315 and coupled to the PCB 315 by glue or otherwise. In one embodiment, the carrier module 100 is surface mounted to the PCB 315. Solder 320 may then be used to electrically couple the carrier contacts 120 with the PCB contacts 310. Solder 320 may bridge any gap between the adjacent sets of contacts to form a good electrical connection between the IC 110 and the PCB 315. The PCB 315 may contain wiring from the PCB contacts 310 to other components on the PCB 315 to facilitate machine to machine communications or for other functions. In one embodiment, the carrier module 100 has a flat bottom surface that contacts the PCB 315 at a corresponding flat surface.

Figure 4:
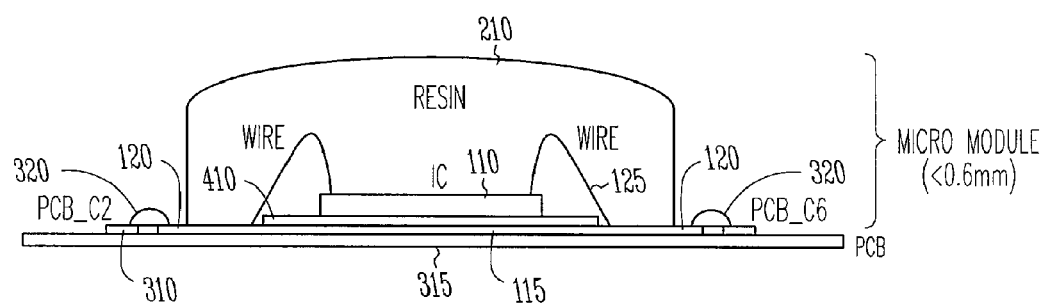
FIG. 4 is a block cross section of the module of FIG. 3 according to an example embodiment.

FIG. 4 is a block cross section of the carrier module 100 of FIG. 3 according to an example embodiment. In this embodiment, an optional additional layer, isolator 410 is provided between the IC 110 and the carrier 115 to prevent electrical shorts between IC 110 and carrier 115. The isolator 410 may be formed as a layer covering the carrier 115, including contacts 120. Before, or after the IC 110 has been attached to the carrier 115, the isolator 410 layer may be etched or otherwise patterned to expose the carrier contacts for attachment of the leads 125 and solder 320. The isolator 410 layer may be formed of a flexible isolating material, such as Kapton® polyimide film from DuPont, in one embodiment.

Figure 5:
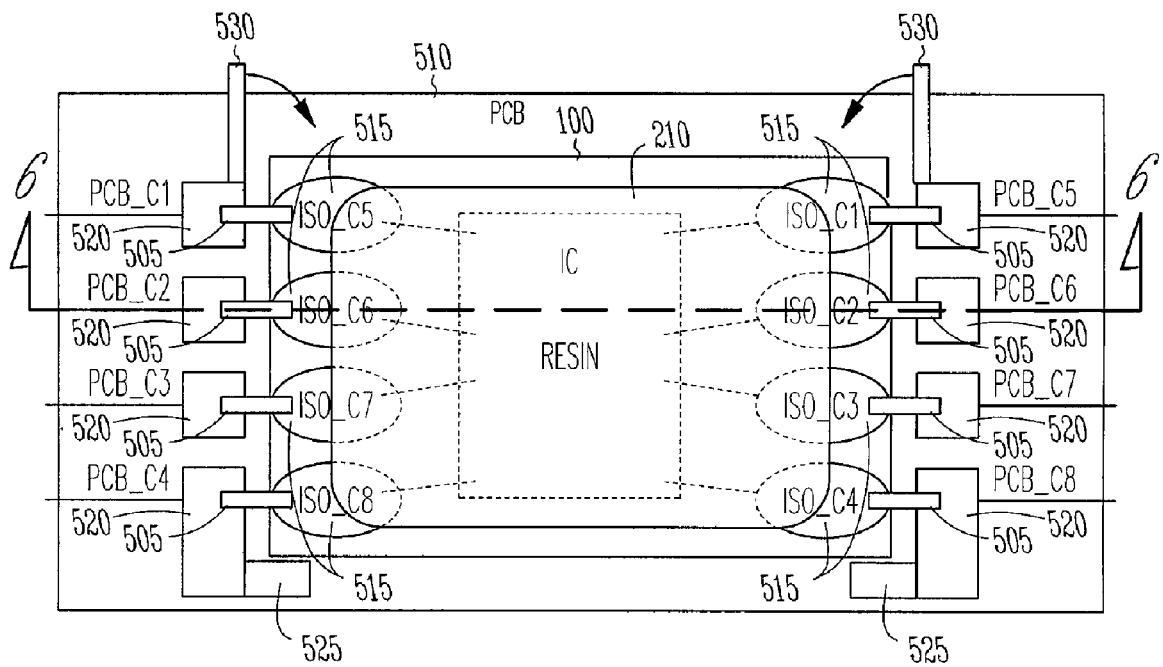
FIG. 5 is a top view of a chip carrier module coupled to a board via spring loaded contacts according to an example embodiment.
Figure 6:
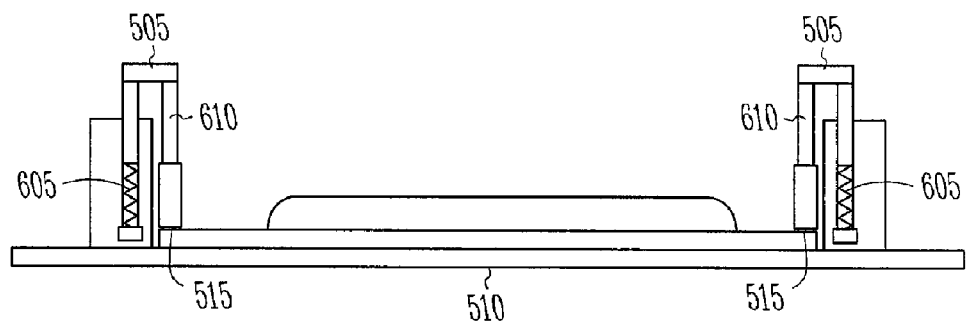
FIG. 6 is a block cross section of the embodiment of FIG. 5 according to an example embodiment.

FIG. 5 is a top view of a chip carrier module 100 coupled to a board via spring loaded contacts 505 according to an example embodiment, and FIG. 6 is a block cross section of the embodiment of FIG. 5 In this embodiment, multiple spring loaded contacts 505 are formed on a PCB 510 to form electrical connection between the PCB 510 and carrier contacts, indicated at 515. In one embodiment, the spring loaded contacts are formed with base structures 520 forming a socket for insertion of the carrier module 100. Two of the base structure 520 include a lateral extension 525 such that the socket blocks the module 100 on three lateral sides. A flipping lock 530 may be used on a fourth lateral side of the module 100. The spring loaded contacts 505 apply a vertical pressure on the contacts 505 to maintain module 100 vertically to ensure resistance to vibration.

In one embodiments, mechanical contacts, such as spring loaded contacts 505, shown in block form, include a spring 605 that is used to spring load a contact arm 610 into electrical contact with carrier contact 515. In various embodiments, many different arrangement of spring loaded contacts may be used, such as a leaf spring contacts, compression fit contacts, reversed push-pull pins, and others. FIG. 6 is functional representation of an example spring loaded contact and is used to represent many different types of spring loaded contacts. In one embodiment, module 100 may be inserted into the socket without tooling, and locked into place, and easily removed when desired.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A device comprising:
a carrier;
an integrated circuit chip supported by the carrier;
multiple carrier contacts supported by the carrier and separated from multiple edges of the integrated circuit chip;
multiple leads coupled between contacts on the integrated circuit chip and the multiple carrier contacts;
a resin encapsulating the integrated circuit chip leaving the multiple carrier contacts at least partially uncovered;
a printed circuit board configured to support the carrier and including base structures forming a socket for insertion of the carrier; and
spring loaded contacts that are configured to couple the carrier to the printed circuit board, wherein the spring loaded contacts are formed with the base structures and configured to maintain the carrier vertically to ensure resistance to vibration.

2. The device of claim 1, further comprising a printed circuit board having printed circuit board contacts arranged to be adjacent the multiple carrier contacts when the carrier is placed on the printed circuit board.

3. The device of claim 2, further comprising solder joints coupling the printed circuit board contacts to the carrier contacts.

4. The device of claim 2, wherein the carrier is surface mounted to the printed circuit board.

5. The device of claim 1, further comprising a plastic card, wherein the carrier is fastened to the plastic card.

6. The device of claim 5 wherein the carrier is fastened to the plastic card by non-conductive glue.

7. The device of claim 1, further comprising an isolation layer disposed between the carrier and the integrated circuit chip, wherein the isolation layer at least partially covers the carrier contacts.

8. A device comprising:
a carrier;
an integrated circuit chip having a first side supported by the carrier and a second side having integrated circuit chip contacts;
multiple carrier contacts supported by the carrier and separated from the integrated circuit chip, wherein the carrier contacts are formed adjacent outside edges of the carrier;
multiple leads coupled between the integrated circuit chip contacts and the multiple carrier contacts, wherein the leads are coupled to a portion of the carrier contacts closer to the integrated circuit than the outside edges of the carrier;
a resin encapsulating the integrated circuit chip and the leads, leaving the multiple carrier contacts proximate the outside edges of the carrier at least partially uncovered;
a printed circuit board configured to support the carrier and including base structures forming a socket for insertion of the carrier; and
spring loaded contacts that are configured to couple the carrier to the printed circuit board, wherein the spring loaded contacts are formed with the base structures and configured to maintain the carrier vertically to ensure resistance to vibration.

9. The device of claim 8, wherein the integrated circuit chip is mounted on the carrier at an approximate center of the carrier.

10. The device of claim 8, wherein the base structures are arranged to be adjacent the multiple carrier contacts when the carrier is placed on the printed circuit board.

11. The device of claim 10, wherein the carrier is surface mounted to the printed circuit board.

12. The device of claim 11 wherein the spring loaded contacts are configured to couple the base structures to the multiple carrier contacts.

13. The device of claim 11 further comprising an isolation layer at least partially covering the carrier contacts.

14. The device of claim 8, wherein at least one of the base structures includes a lateral extension such that the socket is configured to block the carrier on at least one lateral side when the carrier is placed on the printed circuit board.

15. The device of claim 8, further comprising a flipping lock included in the printed circuit board, wherein the flipping lock is configured to be on a lateral side of the carrier when the carrier is placed on the printed circuit board.

16. The device of claim 8, wherein a spring loaded contact includes a spring that is configured to spring load a contact arm into electrical contact with a carrier contact.

17. A method comprising:
forming a carrier having multiple carrier contacts;

forming an integrated circuit chip having a first side supported by the carrier and a second side having integrated circuit chip contacts;

coupling the integrated circuit chip to the carrier such that the carrier contacts are separated from the integrated circuit chip;

connecting multiple leads between the integrated circuit chip contacts and the multiple carrier contacts; and encapsulating the integrated circuit chip with an isolating resin while leaving the multiple carrier contacts at least partially uncovered; and coupling a printed circuit board to the carrier using spring loaded contacts and including base structures forming a socket for insertion of the carrier, wherein the spring loaded contacts are formed with the base structures and configured to maintain the carrier vertically to ensure resistance to vibration.

18. The method of claim 17, further comprising surfacing mounting the carrier to a printed circuit board having printed circuit board contacts arranged to be adjacent the multiple carrier contacts when the carrier is placed on the printed circuit board.

19. The method of claim 18, further comprising forming solder joints to couple the printed circuit board contacts to the carrier contacts.

20. The method of claim 18, further comprising:
forming an isolation layer between the carrier and the integrated circuit chip prior to encapsulating the integrated circuit chip, wherein the isolation layer at least partially covers the carrier contacts; and exposing selected portions of the carrier contacts to facilitate connection of the leads and rib rated circuit board contacts.

* * * * *

UNITED STATES PATENT AND TRADEMARK OFFICE
CERTIFICATE OF CORRECTION

| | |
|---|---|
| PATENT NO. | : 8,159,830 B2 |
| APPLICATION NO. | : 12/426106 |
| DATED | : April 17, 2012 |
| INVENTOR(S) | : Laurent Sustek et al. |

It is certified that error appears in the above-identified patent and that said Letters Patent is hereby corrected as shown below:

On Col. 4, line 50 (Claim 12), delete "11" and insert --11,-- therefor.

On Col. 4, line 53 (Claim 13), delete "11" and insert --11,-- therefor.

On Col. 6, line 15 (Claim 20), delete "rib rated" and insert --printed-- therefor.

Signed and Sealed this
Twelfth Day of June, 2012

David J. Kappos
*Director of the United States Patent and Trademark Office*